(12) United States Patent
Crippa et al.

(10) Patent No.: US 7,863,967 B2
(45) Date of Patent: Jan. 4, 2011

(54) MULTISTAGE REGULATOR FOR CHARGE-PUMP BOOSTED VOLTAGE APPLICATIONS

(76) Inventors: Luca Crippa, Via Manzoni, 66, 20040 Busnago (IT); Miriam Sangalli, Via XXV Aprile, 11D, 20061 Carugate (IT); Giancarlo Ragone, Vicolo III Micarè, 43, 89047 Roccella Jonica (IT); Rino Micheloni, Via Luini, 11, 22078 Turate (IT)

( * ) Notice: Subject to any disclaimer, the term of this patent is extended or adjusted under 35 U.S.C. 154(b) by 232 days.

(21) Appl. No.: 11/460,370

(22) Filed: Jul. 27, 2006

(65) Prior Publication Data

US 2007/0164811 A1 Jul. 19, 2007

(30) Foreign Application Priority Data

Jul. 28, 2005 (EP) .................................. 05425558

(51) Int. Cl.
G05F 1/46 (2006.01)
G11C 16/30 (2006.01)
(52) U.S. Cl. ................. 327/541; 327/537; 327/543; 365/189.09
(58) Field of Classification Search ............ None
See application file for complete search history.

(56) References Cited

U.S. PATENT DOCUMENTS

| | | | |
|---|---|---|---|
| 5,706,240 A * | 1/1998 | Fiocchi et al. ............ 365/226 |
| 5,892,390 A * | 4/1999 | Tobita ..................... 327/543 |
| 5,936,388 A | 8/1999 | Casper .................... 323/273 |
| 6,347,029 B1 | 2/2002 | Ouyang et al. ........... 361/93.9 |
| 6,480,421 B2 * | 11/2002 | Osama et al. ........... 365/185.21 |
| 6,922,099 B2 * | 7/2005 | Shor et al. ................ 327/543 |
| 6,927,620 B2 * | 8/2005 | Senda ...................... 327/536 |
| 7,254,084 B2 * | 8/2007 | Terasawa et al. .......... 365/229 |
| 7,394,306 B2 * | 7/2008 | Chen ....................... 327/541 |
| 7,564,300 B2 * | 7/2009 | Lee ......................... 327/540 |
| 2002/0118568 A1 | 8/2002 | Tanzawa ................ 365/185.11 |

\* cited by examiner

*Primary Examiner*—Lincoln Donovan
*Assistant Examiner*—Terry L Englund
(74) *Attorney, Agent, or Firm*—Schwabe, Williamson & Wyatt, P.C.

(57) ABSTRACT

A multistage circuit for regulating the charge voltage or the discharge current of a capacitance of an integrated device at a certain charge-pump generated boosted voltage is implemented without integrating high voltage transistor structures having a type of conductivity corresponding to the same sign of the boosted voltage (high-side transistors). The multistage circuit current includes at least a first stage, and an output stage in cascade to the first stage and coupled to the capacitance. The first stage is supplied at an unboosted power supply voltage of the integrated device, and the output stage is supplied at an unregulated charge-pump generated boosted voltage. The first stage includes a transistor having a type of conductivity corresponding to an opposite sign of the boosted voltage and of the power supply voltage. The drain of the output stage transistor is coupled to the boosted voltage either through a resistive pull-up or a voltage limiter.

8 Claims, 5 Drawing Sheets

MULTISTAGE REGULATOR FOR CHARGE-PUMP BOOSTED VOLTAGE APPLICATIONS

FIELD OF THE INVENTION

The present invention relates to integrated circuits that include charge-pump voltage boosting circuits, and in particular, to a multistage circuit for regulating a boosted voltage generated by a charge-pump voltage multiplier circuit or for regulating the discharging of a capacitance that may be charged at a boosted voltage.

BACKGROUND OF THE INVENTION

Whenever certain circuits of an integrated device require supply, control or biasing voltages higher than the power supply voltage of the integrated device, it is a general practice of integrating dedicated charge-pump voltage multipliers for generating a boosted voltage of the required level.

Often the boosted voltage generated by a common charge-pump circuit needs to be regulated for ensuring a correct bias. That is, a boosted voltage that remains within a specified range notwithstanding the current absorbed by the biased load or circuit. In these cases a dedicated circuit for regulating the voltage on an output node of the regulator to which the circuit or load to be powered, biased or controlled is connected. This configuration may generally be equated to a capacitive load. Similarly, a capacitance that eventually may be charged at a high voltage, e.g., at a charge-pump boosted voltage, may need to be discharged in a controlled manner such as with a certain discharge circuit. Also in this case, a dedicated regulating circuit needs to be integrated.

An important example of an integrated device with these requirements is a non-volatile memory device that commonly requires biasing voltage levels higher than the power supply voltage of the device during program/erase phases of operation. For example, in a multi-level flash memory device of a NAND type, program/erase operations may require boosted voltages starting from around 10V and up to about 20-22V.

In one-bit/cell flash memories, such a dedicated voltage regulator may be omitted and the output voltage of the charge-pump circuit can be employed directly, without any regulation, by relying solely on the ON-OFF control of the charge-pump circuit that generates the boosted voltage. In one-bit/cell flash memories, a ripple of about 1V to 3V on the boosted voltage output by the ON-OFF controlled charge-pump circuit is generally tolerable.

In contrast, in multi-level memory devices, where more bits can be stored in each single cell of the memory array, the much higher precision that is required for the biasing voltages makes indispensable integration of a dedicated boosted voltage regulator to reduce the amplitude of the ripple on the output biasing voltages that are required during different phases of operation of the memory.

Similar requirements of precision for the output boosted voltages are encountered also in other integrated devices, in which cases the same requirement of integrating a dedicated regulating circuit of the boosted voltages generated by the charge-pump circuit arises.

On a different account, fabrication technologies of integrated devices strive to contain costs. This cost awareness of chip manufacturing, especially for devices designed for mass production and intended primarily for consumer markets, imposes to produce devices at the lowest price per unit as possible. Technological advances in silicon processing are exploited to reduce the number of critical processing steps and the number of masks required.

As noted above, an important example of this category of integrated devices are non-volatile memories. The fabrication technology of non-volatile memories is so streamlined for reducing costs that it does not generally permit formation along the normal low voltage (LV) CMOS structures special high voltage (HV) structures unless additional processing steps and relative masks are introduced for realizing the high side transistor of the CMOS structure. High voltage structures include transistors capable of withstanding a relatively high voltage. For a NAND type flash memory, which is generally supplied with positive voltages, both for the normal power supply voltage and for charge-pump boosted voltages, the high voltage transistor is the PMOS transistor. The low side transistor, generally the NMOS transistor, may be realized with an appropriate high voltage structure where needed without significant changes in terms of costs of the fabrication process.

According to the most common fabrication processes of these types of integrated devices, the PMOS transistor of the CMOS pair (PMOS+NMOS) is the critical structure that does not admit voltage differences among its terminals (source, drain, gate and bulk) above about 4V to 5V, as readily known by those skilled in the art.

When a positive boosted voltage regulating circuit to be supplied at an unregulated charge-pump boosted voltage in the range of 20-24V is required for fabricating a multilevel non-volatile flash memory, the normal low voltage PMOS transistor structure of the voltage regulator that is realized with the processing steps of any low cost one bit/cell flash memory fabrication process may often be intrinsically unsuitable. Therefore, additional costs of modifying the normal process introducing additional dedicated masks for realizing a high voltage PMOS structure cannot be avoided.

To illustrate the problem, FIG. 1 shows a typical multistage circuit powered at an unregulated charge-pump boosted voltage $V_{PUMP}$ for regulating the voltage $V_{OUT}$. In the example shown, the first stage is a differential stage, to a first input of which is coupled a reference (control) voltage $V_{REF}$ and to a second input of which a scaled replica $V_{FEED}$ of the output voltage $V_{OUT}$ is fed back. The output stage is a PMOS transistor $M_{POUT}$ that necessarily needs to have a high voltage structure in order to withstand the relatively high level of $V_{PUMP}$, which is the unregulated charge-pump output voltage.

In fact, as already mentioned, a similar problem of handling a charge-pump boosted voltage without integrating transistor structures of a conductivity type for the sign of the boosted voltage with special high voltage characteristics, arises when a capacitance that is eventually charged at a boosted voltage needs to be discharged with a current regulated by a dedicated regulating circuit.

SUMMARY OF THE INVENTION

In view of the foregoing background, an object of the present invention is to provide a less expensive alternative approach to integrating high voltage PMOS structures specifically for implementing the required regulating circuits of a charge-pump generated boosted voltage, and of the discharge current of a capacitance charged at the boosted voltage.

This cost saving objective is accomplished by a multistage circuit for regulating the charge voltage or the discharge current of a capacitance of an integrated device at a certain charge-pump generated boosted voltage that can be safely implemented without needing to integrate high voltage transistor structures of a type of conductivity for the same sign of the boosted voltage (i.e., the high-side transistors).

Yet another object of the present invention is to provide a multi-level non-volatile flash memory device comprising a boosted voltage regulator that can be entirely fabricated with a low cost non-volatile flash memory fabrication process.

Basically, the multistage circuit for regulating the charge voltage or the discharge current of a capacitance in an integrated device, comprising at least a first stage and an output stage in cascade to the first stage and coupled to the capacitance, has the first stage supplied at an unboosted power supply voltage of the integrated device. The output stage may be supplied at an unregulated charge-pump generated boosted voltage and may comprise a transistor of a type of conductivity opposite for the sign of the boosted voltage and of the power supply voltage.

The drain of the output stage transistor may be coupled to the boosted voltage either through a resistive pull-up or a voltage limiter.

DETAILED DESCRIPTION OF THE PREFERRED EMBODIMENTS

Figure 1:
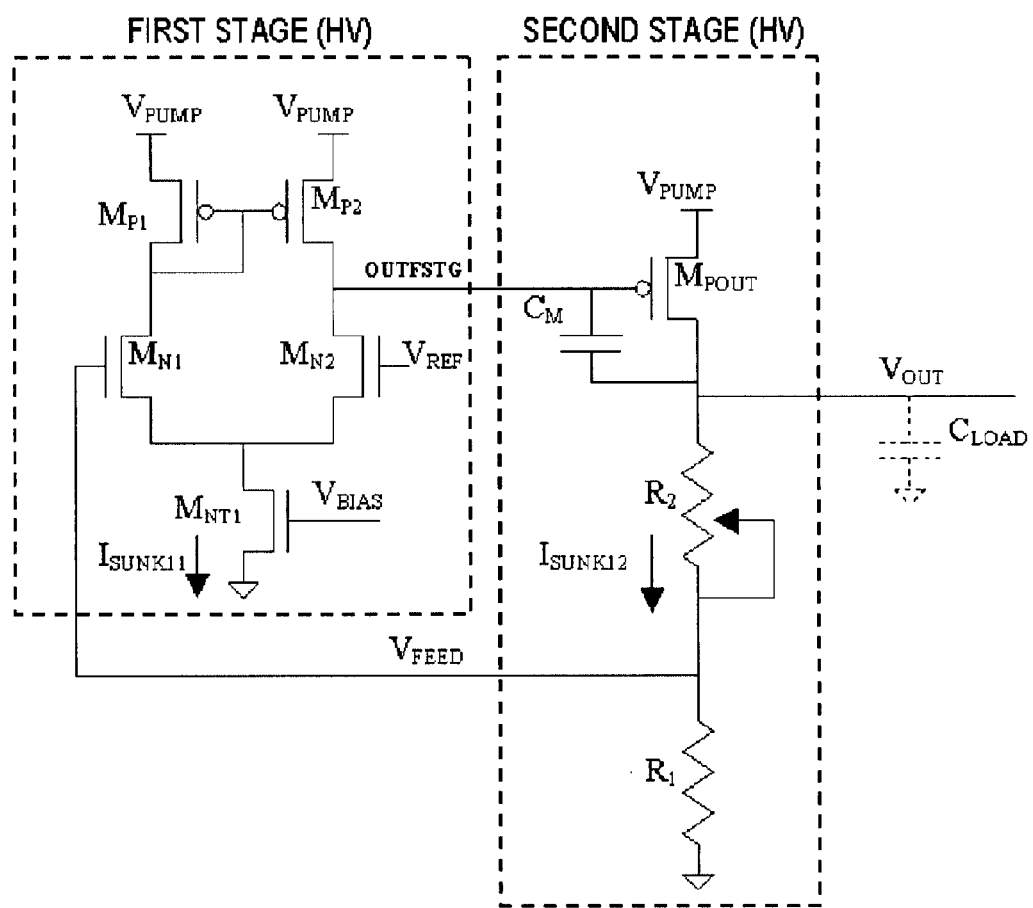
FIG. 1 depicts a typical multistage voltage regulator of a charge-pump boosted voltage to be applied on a capacitance in accordance with the prior art.
Figure 2:
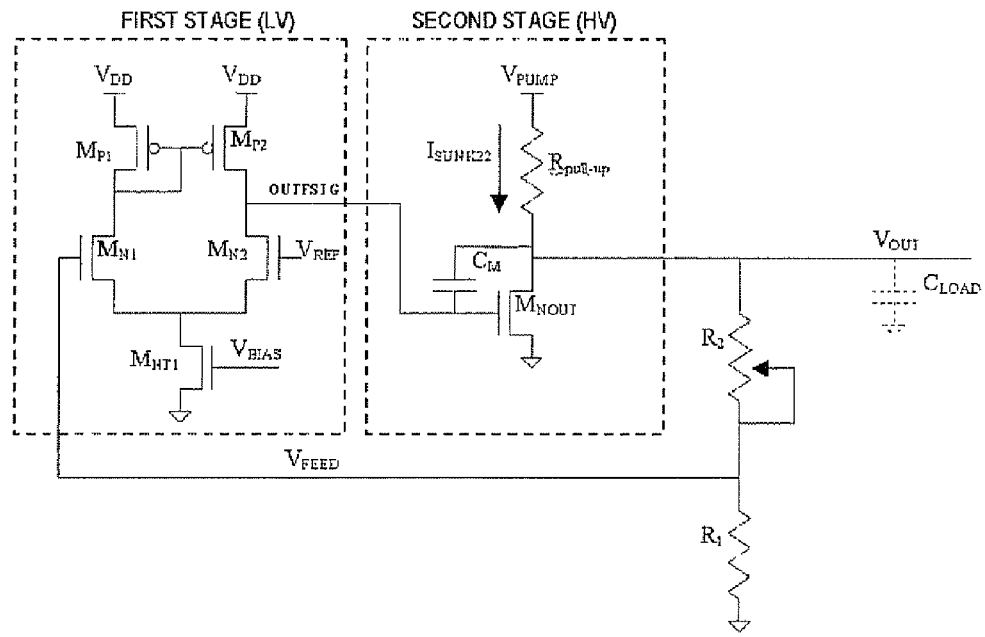
FIG. 2 depicts a multistage voltage regulator in accordance with the present invention that is functionally comparable to the voltage regulator of FIG. 1.

A first example embodiment of the invention, intended to provide a viable alternative to the known voltage regulator of FIG. 1 without requiring the formation of any high voltage CMOS structure, is depicted in FIG. 2. As shown, the first stage $M_{P1}$, $M_{P2}$, $M_{N1}$, $M_{N2}$, $M_{NT1}$ is a common differential stage FIRST STAGE (LV) that is powered at a normal (unboosted) power supply voltage $V_{DD}$. The output stage SECOND STAGE (HV) is supplied at the unregulated charge-pump generated boosted voltage $V_{PUMP}$.

By powering the first stage FIRST STAGE (LV) at $V_{DD}$, the PMOS transistors of the normal low voltage (LV) structure $M_{P1}$ and $M_{P2}$ may be used for the load current mirror of the two branches of the differential stage. The output stage SECOND STAGE (HV) is implemented by using a HV NMOS transistor $M_{NOUT}$ with a resistive pull-up $R_{PULL-UP}$ connected to the boosted voltage node $V_{PUMP}$. The boosted voltage node $V_{PUMP}$ is the output node of a charge-pump voltage multiplier (not shown) that generates the required boosted voltage $V_{PUMP}$.

In case of a relatively heavy capacitive load $C_{LOAD}$ to be driven, the basic multistage voltage regulator circuit of FIG. 2 may have an excessive consumption. In fact, assuming that the total capacitive load $C_{LOAD}$ is about 100 pF, the time needed for charging the parasitic capacitance would be on the order of three to five times $T_{rise}$, depending on the value of the output voltage to be produced on the capacitive load, wherein:

$$T_{rise} = C_{LOAD} * R_{PULL-UP} \quad (1)$$

If a 100 pF capacitance needs to be completely charged at a certain programmed boosted voltage $V_{OUT}$ in a 1 µs time interval, the value of the pull-up resistance should be:

$$R_{pull-up} = \frac{Trise}{3*Cload} \cong 3 \text{ K}\Omega \quad (2)$$

Assuming that the voltage $V_{OUT}$ to be produced on the load capacitance is 10V and that the unregulated boosted voltage output by the charge-pump circuit $V_{PUMP}$ is 24V, the steady state current absorption from the charge-pump output node would be:

$$I_{SUNK22} = \frac{(24-10) \text{ V}}{2 \text{ K}\Omega} \cong 5 \text{ mA} \quad (3)$$

Figure 3:
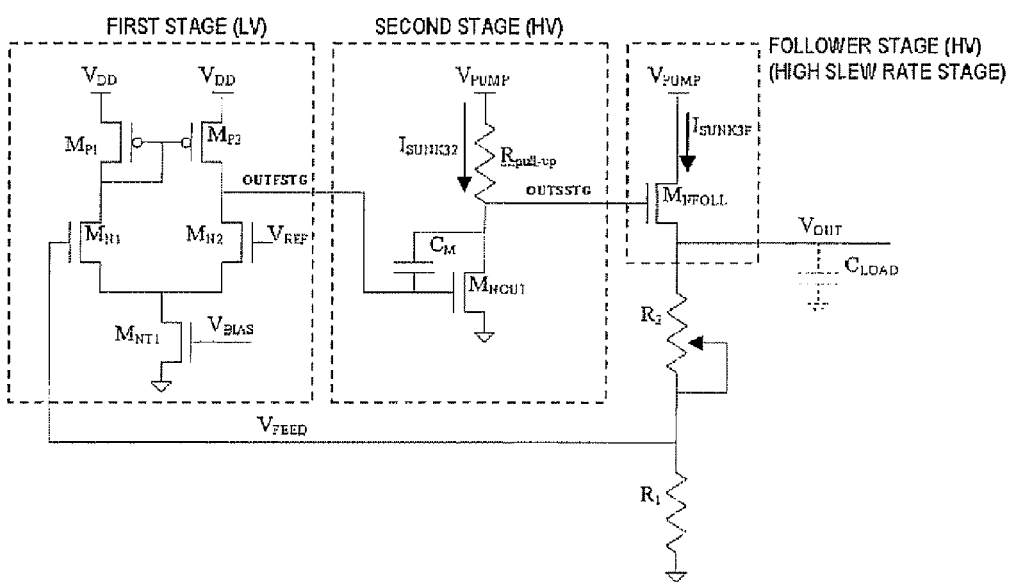
FIG. 3 depicts an alternate embodiment of the voltage regulator of FIG. 2 including an output follower stage functioning as an output current buffer.

Clearly, a charge-pump circuit of such a large current capability would be impractical in most cases, such as in a compact large capacity non-volatile memory device for example. To render current absorption independent from the load, an alternative embodiment of the basic circuit of FIG. 2 may be as depicted in FIG. 3, according to which an output follower stage FOLLOWER STAGE (HV) that is a high slew rate stage is added as a current buffer to charge the load capacitance $C_{LOAD}$ at the regulated boosted voltage $V_{OUT}$.

The follower stage is implemented with a high voltage NMOS transistor having its current terminals connected to the unregulated boosted voltage $V_{PUMP}$ and to the output node $V_{OUT}$, to which the resistive output voltage divider $R_1$, $R_2$ of the feedback line $V_{FEED}$ is connected.

The advantage of this alternative embodiment is that at steady state, the current absorption of the output follower stage $M_{NFOLL}$ will be an identical value to that of the prior art circuit of FIG. 1, which is given by:

$$I_{SUNK3F} = I_{SUNK12} = \frac{V_{OUT}}{R_1 + R_2} \quad (4)$$

Differently from the first embodiment of FIG. 2, the capacitive load $C_{LOAD}$ is no longer charged to $V_{OUT}$ through the pull-up resistance $R_{PULL-UP}$, but through the output follower stage $M_{NFOL}$ that is capable of delivering relatively high currents at charge transients. The pull-up resistance $R_{PULL-UP}$ is completely untied from the load and may be freely dimensioned for reducing steady state absorption from the charge-pump generator. In any case, such a pull-up resistance needs to be capable of charging the gate of the output follower transistor in a sufficiently short time.

The difference from the circuit of FIG. 2 is that according to this preferred embodiment, the load represented by the capacitance of the gate of the follower stage transistor is many orders of magnitude less than the driven capacitance $C_{LOAD}$. Therefore, it is possible to employ a pull-up resistance on the order of hundreds of kilo-ohms.

For example, using a pull-up resistance of 200 KΩ for a programmed $V_{OUT}$ of 10V, and assuming that between the gate and source of the NMOS transistor $M_{NFOLL}$ of the follower stage there is a voltage drop of a threshold (about 1V), the current absorbed from the charge-pump output will be given by:

$$I = \frac{(24-11)\text{ V}}{200\text{ K}\Omega} \cong 65\text{ }\mu\text{A} \tag{5}$$

Such a current consumption of the regulating circuit is practically about the same as that of the first differential stage of the prior art regulator of FIG. 1. Of course, for higher output voltages the current consumption of the regulating circuit will decrease.

To summarize, when comparing the current absorption of the regulator of FIG. 3 with that of the prior art circuit of FIG. 1, the following remarks may be made. The output follower stage consumes as the output stage of the prior art circuit of FIG. 1 ($I_{SUNK3F}=I_{SUNK22}$). The first stage of the regulator circuit of the invention, being supplied at $V_{DD}$, does not absorb current from the charge-pump. The second stage of the circuit of FIG. 3 practically absorbs about the same current as the first differential stage of the prior art circuit of FIG. 1 ($I_{SUNK32}\approx I_{SUNK11}$). Therefore, according to the embodiment of FIG. 3, the multistage regulating circuit does not have a current absorption from the charge-pump greater than the prior art circuit of FIG. 1.

By simulating operation, the circuit according to the embodiment of FIG. 3 has performances in terms of gain, cut off frequency, transients and PSRR, equal or better than the prior art circuit of FIG. 1. Of course, it will be evident to those skilled in the art, the circuit of FIG. 3 may be improved further in terms of maximum output voltage handling capability by employing transistors formed in a triple well (for eliminating the body effect on the follower stage) and natural transistors (for reducing the gate-source voltage drop of the follower stage).

Figure 4:
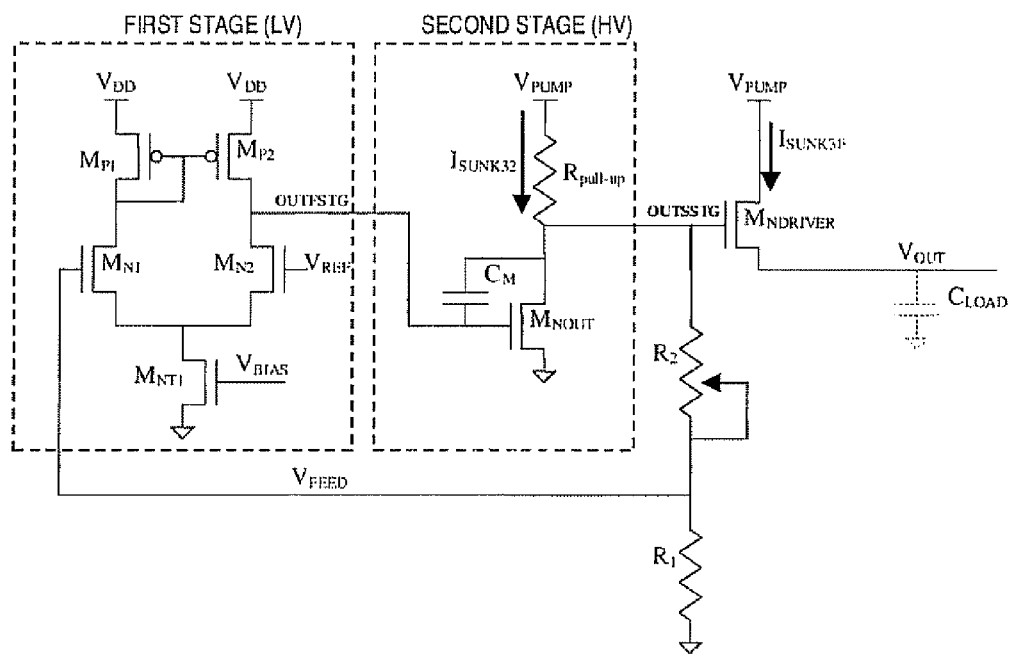
FIG. 4 depicts an alternate embodiment of a voltage regulator for charging the capacitance with a voltage ramp in accordance with the present invention.

A further embodiment of a voltage regulator for charging the load capacitance $C_{LOAD}$ with a voltage ramp by applying to the input $V_{REF}$ a low voltage control ramp is depicted in FIG. 4. The control low voltage ramp applied to the $V_{REF}$ input node of the first differential stage is amplified and reproduced on the node OUTSSTG.

Figure 5:
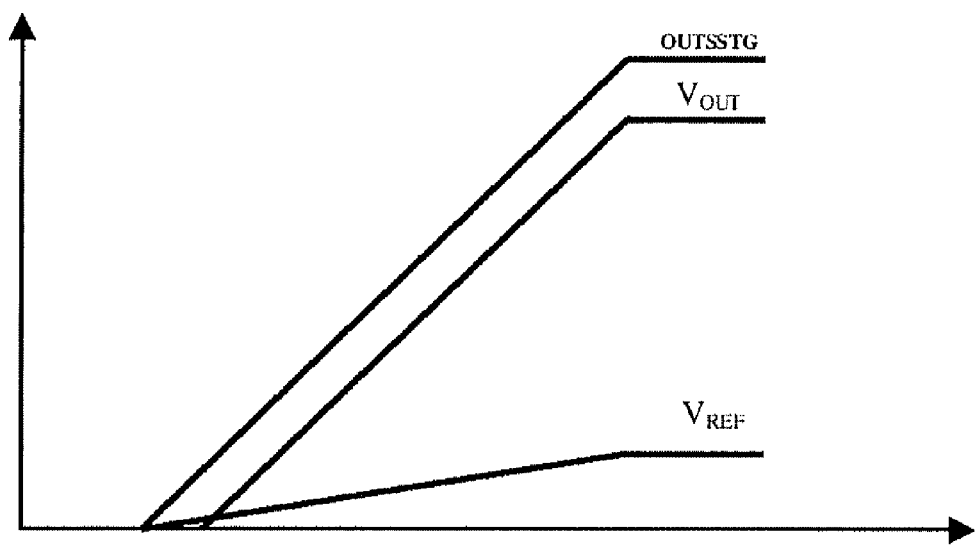
FIG. 5 is a graph illustrating the characteristics of the voltage regulator of FIG. 4.

On the output node $V_{OUT}$ a voltage ramp equal to OUT-SSTG less the threshold of the $M_{NDRIVER}$ will be generated. The relative voltage characteristics are shown in FIG. 5. An open loop regulation is implemented for driving heavy capacitive loads without encountering stability problems in the feedback part of the multistage voltage regulator circuit.

Figure 6:
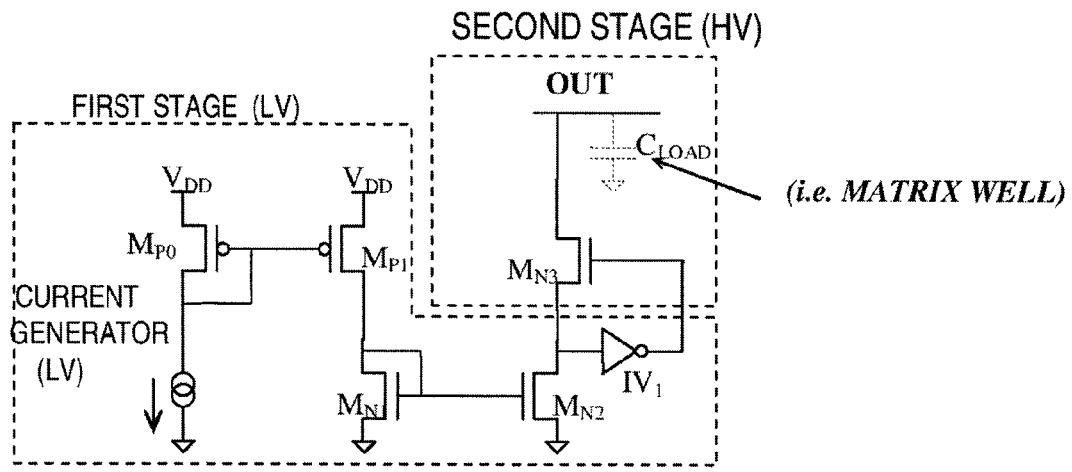
FIG. 6 depicts a multistage circuit for regulating the discharge current of a capacitance charged at a boosted voltage in accordance with the present invention.

FIG. 6 shows a different embodiment useful for regulating the discharge current of a capacitance $C_{LOAD}$ that during operation of the integrated device is charged at a boosted voltage. For example, for discharging the well region of a flash memory cell array at the end of an ERASE operation when the well may be charged at 22V.

The low voltage part of the regulating circuit, that is the first stage FIRST STAGE (LV) that is supplied at a normal (LV) power supply voltage $V_{DD}$, is composed of a low voltage current generator (LV), a first current mirror referred to $V_{DD}$, and made with LV PMOS transistors $M_{P0}$ and $M_{P1}$, and a second current mirror referred to a ground potential made with LV NMOS transistors $M_{N1}$ and $M_{N2}$. The drain of the low voltage NMOS transistor $M_{N2}$ is connected to the load capacitance $C_{LOAD}$ to be discharged through a drain limiter stage, composed of the inverter $I_{V1}$ and by the high voltage output NMOS transistor $M_{N3}$ that forms a high voltage output stage SECOND STAGE (HV) coupled to the capacitance $C_{LOAD}$ charged at the boosted voltage of the node OUT.

In this way, the node OUT (e.g., the well of the memory array) that is charged at a relatively high boosted voltage (e.g., 22V) is effectively decoupled from the drain node of the low voltage transistor $M_{N2}$ of the second current mirror of the first stage by the high voltage output stage SECOND STAGE (HV), which is formed by the high voltage NMOS output transistor $M_{N3}$.

In this way, a regulating circuit for discharging at a certain constant current a capacitance $C_{LOAD}$ that is charged at a boosted voltage is provided, the control part of which FIRST STAGE (LV) is entirely made with low voltage transistors. This enhances reliability and performance while decreasing area occupation and consumption.

Figure 7:
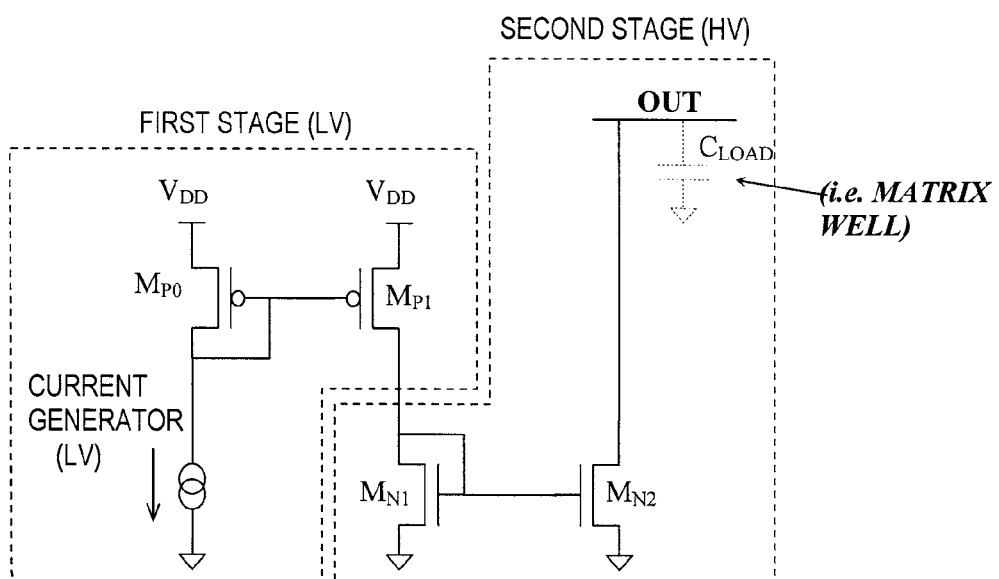
FIG. 7 depicts an alternate embodiment of the discharge current regulator circuit of FIG. 4.

An alternative embodiment of such a regulating circuit for discharging at a controlled current a capacitance charged at a boosted voltage is shown in FIG. 7. According to this alternative embodiment, instead of employing a drain limiter circuit, the pair of NMOS transistors forming the second current mirror $M_{N1}$ and $M_{N2}$ are both formed with a high voltage structure. In this case, the second current mirror forms the output high voltage stage SECOND STAGE (HV) of the two stage regulating circuit.

Figure 8:
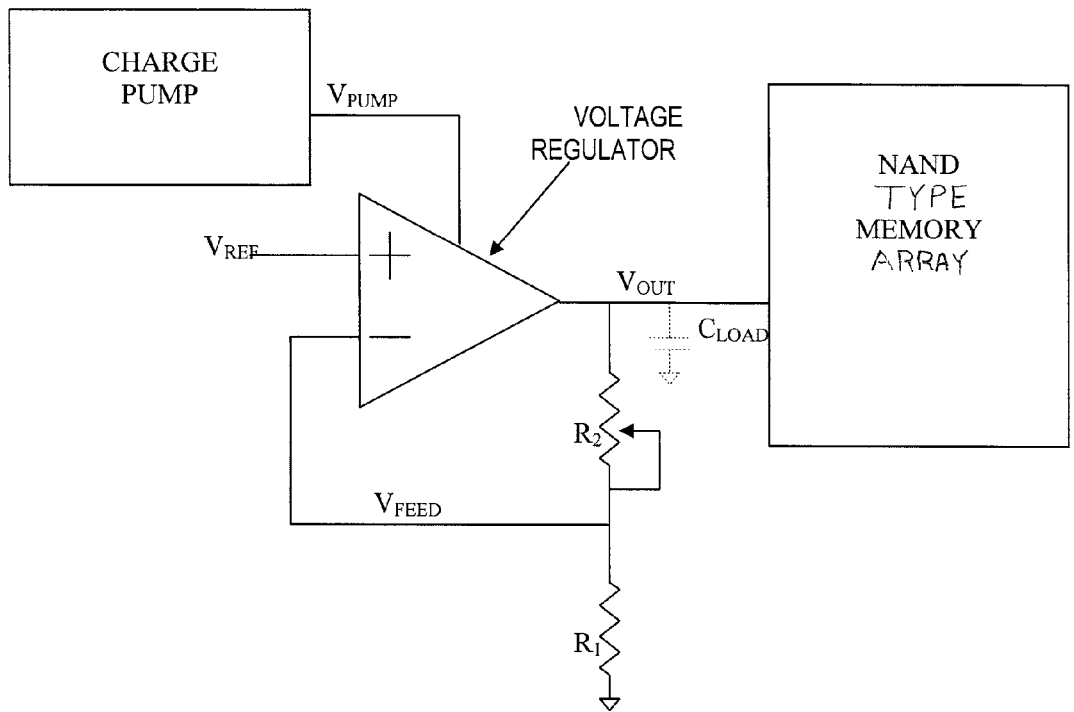
FIG. 8 depicts a multilevel memory device in accordance with the present invention.

A multilevel memory device is shown in FIG. 8. The memory device comprises a memory array, a charge-pump for programmably generating a charge-pump voltage $V_{PUMP}$ for the memory array, and a multistage voltage regulator for regulating the charge-pump voltage. The memory array comprises a NAND type, for example. The multistage voltage regulator comprises a first stage, and a second stage in cascade with the first stage as described above.

That which is claimed:

1. A multistage voltage regulator circuit for regulating a charge voltage on a load of an integrated device, the charge voltage being provided at a charge-voltage node by a charge-pump, the circuit comprising:
    a first stage to receive an unboosted power supply voltage relative to a reference voltage;
    a second stage in cascade with the first stage and to be coupled to the load of the integrated device, the second stage to receive the charge voltage and to provide a regulated boosted voltage, the second stage comprising:
        at least one high voltage transistor having a conductivity type opposite a sign of the charge voltage and of the unboosted power supply voltage, and
        a pull-up resistor coupled between the at least one high voltage transistor and the charge voltage node; and
    a feedback line to provide a scaled replica of the regulated boosted voltage to the first stage.

2. The circuit according to claim 1, wherein the feedback line is coupled to an output of the second stage.

3. A multilevel memory device comprising:
    a memory array;
    a charge-pump circuit to programmably generate a charge-pump voltage for the memory array; and
    a multistage voltage regulator circuit to regulate the charge-pump voltage, and comprising
        a first stage to receive an unboosted power supply voltage relative to a reference voltage, and
        a second stage in cascade with the first stage and coupled to the memory array, the second stage to receive the charge-pump voltage, the second stage comprising:

at least one high voltage transistor having a conductivity type opposite a sign of the charge-pump voltage and of the unboosted power supply voltage, and a pull-up resistor coupled between the at least one high voltage transistor and the charge-pump circuit;

an output follower stage to provide a regulated boosted voltage coupled between the second stage and the memory array, the output follower stage comprising another high voltage transistor having the conductivity type and configured to receive the charge-pump voltage; and a feedback line to provide a scaled replica of the regulated boosted voltage to the first stage.

4. The multilevel memory device according to claim 3, wherein the feedback line is coupled between the output follower stage and the first stage, and wherein an output from the second stage controls the output follower stage.

5. The multilevel memory device according to claim 3, wherein the memory array comprises a NAND type memory array.

6. A method for making a multistage voltage regulator circuit for regulating a charge voltage on a load of an integrated device, the charge voltage being provided at a charge-voltage node by a charge-pump, the method comprising:

providing a first stage for receiving an unboosted power supply voltage relative to a reference voltage;

coupling a second stage between the first stage and the load of the integrated device, the second stage to receive the charge voltage and comprising:

at least one high voltage transistor having a conductivity type opposite a sign of the charge voltage and of the unboosted power supply voltage, and a pull-up resistor coupled between the at least one high voltage transistor and the charge voltage node;

coupling an output follower stage between the second stage and the load of the integrated device to provide a regulated boosted voltage, the output follower stage comprising another high voltage transistor having the conductivity type and configured to receive the charge voltage; and providing a feedback line to provide a scaled replica of the regulated boosted voltage to the first stage.

7. The method according to claim 6, wherein the feedback line is coupled between the output follower stage and the first stage, and wherein the second stage controls the output follower stage.

8. A multistage voltage regulator circuit to regulate a charge voltage on a load of an integrated device, the charge voltage to be provided by a charge-pump, the circuit comprising:

a first stage to receive an unboosted power supply voltage relative to a reference voltage;

a second stage in cascade with the first stage and to be coupled to the load of the integrated device, the second stage to receive the charge voltage and comprising at least one high voltage transistor having a conductivity type opposite a sign of the charge voltage and of the unboosted power supply voltage, wherein the at least one high voltage transistor in the second stage forms a drain limiter stage, the at least one high voltage transistor comprising a control terminal; and wherein the first stage comprises:

a current generator;

a first current mirror to receive the unboosted power supply voltage and coupled to the current generator;

a second current mirror coupled to the first current mirror and configured to mirror current generated by the current generator, and comprising an output transistor, the output transistor comprising a conduction terminal coupled to the drain limiter stage; and an inverter coupled to the conduction terminal of the output transistor and to the control terminal of the at least one high voltage transistor for control thereof.

* * * * *